(12) United States Patent
Narita et al.

(10) Patent No.: US 6,275,367 B1
(45) Date of Patent: Aug. 14, 2001

(54) SEMICONDUCTOR CIRCUIT DEVICE WITH HIGH ELECTROSTATIC BREAKDOWN ENDURANCE

(75) Inventors: Kaoru Narita; Takeo Fujii, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/323,518

(22) Filed: Jun. 1, 1999

Related U.S. Application Data

(62) Division of application No. 08/904,917, filed on Aug. 1, 1997, now Pat. No. 5,973,901.

(30) Foreign Application Priority Data

Aug. 1, 1996 (JP) .................................... 8-203441

(51) Int. Cl.[7] .................................................. H02H 3/20
(52) U.S. Cl. .............................. 361/91.5; 361/56; 361/111
(58) Field of Search ...................... 361/56, 91.1, 91.5, 361/91.6, 91.8, 111, 86, 118, 212, 220

(56) References Cited

U.S. PATENT DOCUMENTS

| | | |
|---|---|---|
| 4,596,936 | 6/1986 | Aoyama . |
| 4,839,768 | 6/1989 | Daniels et al. . |
| 4,870,530 | 9/1989 | Hurst et al. . |
| 5,442,217 | 8/1995 | Mimoto . |
| 5,515,225 | 5/1996 | Gens et al. . |
| 5,625,522 | 4/1997 | Watt . |
| 5,706,156 | 1/1998 | Narita . |
| 5,717,559 | 2/1998 | Narita . |
| 5,721,656 | 2/1998 | Wu et al. . |
| 5,724,219 | 3/1998 | Narita . |

FOREIGN PATENT DOCUMENTS

| | | |
|---|---|---|
| 2-119169 | 7/1990 | (JP) . |
| 5-160349 | 6/1993 | (JP) . |
| 6-151717 | 5/1994 | (JP) . |
| 7-86510 | 3/1995 | (JP) . |
| 9-199670 | 7/1997 | (JP) . |

OTHER PUBLICATIONS

"A Novel On–Chip Electrostatic Discharge (ESD) Protection for Beyond 500MHz DRAM", IEDM 95, pp. 539–542 (No date).

*Primary Examiner*—Michael J. Sherry

(57) ABSTRACT

In a semiconductor circuit device, an internal circuit, a common wiring pattern, a plurality of external terminals including a ground terminal, and a plurality of protection elements is provided. Each of the plurality of protection elements is connected to one of the plurality of external terminals and the common wiring pattern. Each protection element includes a clamp circuit. The clamp circuit of each of the plurality of protection elements respectively connected to the plurality of external terminals other than the ground terminal has a clamp voltage higher than a power supply voltage supplied to the internal circuit. On the other hand, the clamp circuit of the protection element connected to the ground terminal as a ground terminal clamp circuit has a clamp voltage lower than those of the clamp circuits other than the ground terminal clamp circuit.

11 Claims, 7 Drawing Sheets

SEMICONDUCTOR CIRCUIT DEVICE WITH HIGH ELECTROSTATIC BREAKDOWN ENDURANCE

CROSS-REFERENCE TO RELATED APPLICATION

This application is a division of application Ser. No. 08/904,917 filed Aug. 1, 1997 and matured into U.S. Pat. No. 5,973,901 issued Oct. 26, 1999.

BACKGROUND OF THE INVENTION

1. Field of the Invention

The present invention relates to a semiconductor circuit device, and more particularly to an electrostatic protection circuit with high reliability.

2. Description of the Related Art

In a first example of a conventional electrostatic protection circuit shown in FIG. 1, a common wiring pattern 110 is provided on a semiconductor chip. Each of all terminals such as a power supply (Vdd) terminal 101, a ground (GND) terminal 102, and input/output terminals 103 and the common wiring pattern are connected by a parallel protection element composed of a parasitic bipolar element and a diode element. In the electrostatic protection circuit having such a structure, a completely equivalent discharge path can be established in any combination of any terminals and also any positive or negative application voltage mode. Therefore, the electrostatic protection circuit having high reliability can be easily provided.

The operation of the electrostatic protection circuit will be described with reference to FIG. 1. Referring to FIG. 1, all terminals including the power supply (Vdd) terminal 101 and the ground (GND) terminal 102 are connected to the common wiring pattern 110 by the protection element, i.e., a parallel circuit composed of a bipolar element and a diode. When a positive electrostatic pulse is applied to the input terminal 103 with respect to the GND terminal as a reference point, a discharge path is the path of the input terminal 103→the bipolar element Q103 of the input terminal→the common wiring pattern 110→the diode D102 of the GND terminal→GND terminal 102. Current flows through this discharge path to protect an internal circuit 120. Also, in a case where a negative electrostatic pulse is applied to the input terminal 103 with respect to the GND terminal 102 as the reference point, current flows through the discharge path of the GND terminal 102→the bipolar element Q102 of the GND terminal the common wiring pattern 110→the diode D103 of the input terminal→the input terminal 103, to protect the internal circuit.

FIG. 2 shows the current (I)–voltage (V) characteristics between the ground terminal 102 and one of the terminals other than the ground terminal 102, e.g., the input terminal 103, when the impedance of the internal circuit 120 is infinite in the first conventional example shown in FIG. 1, that is, when only the electrostatic protection circuit and the common wiring pattern are connected to each of these terminals. In this case, when an over-voltage is applied between the ground terminal 102 and the other terminal such as the input terminal 103 and the over-voltage reaches Vtp (Vtm in case of the negative over-voltage), a trigger current starts to flow through the protection element. When the trigger current higher than a threshold value flows, the bipolar element operates to clamp the applied voltage to a predetermined voltage of Vsbp (Vsbm). In this case, the current flows through the bipolar element and the diode, even when the over-voltage is a positive polarity or a negative polarity. Therefore, if a parasitic resistance can be ignored, the clamped voltage can be expressed as $$Vsbp = |Vsbm| = Vc + Vbi,$$

where Vc is the clamped voltage by the bipolar element and Vbi is the built-in voltage of the diode. For example, when a bipolar element is the parasitic bipolar transistor manufactured in a MOSLSI process in accordance with the $0.6\text{-}\mu$ rule, Vc is about 7 V and Vbi is about 0.9 V. As seen from these values, the clamped voltage Vsbp and |Vsbm| are about 8 V. In this way, when the internal circuit 120 is not connected to the terminals 102 and 103, the electrostatic protection circuit operates completely symmetrically and operates ideally.

However, actually, there is a case that the internal circuit 120 has the impedance characteristic shown in FIG. 3, resulting in degradation of protection capability. The reason of the degradation of the protection capability will be described below in detail.

FIG. 3 shows the I–V characteristic of the internal circuit 110 with a voltage being applied between the power supply terminal 101 and the ground terminal 102. When a positive voltage is applied to the terminal 101 or 103 with respect to the ground terminal 102, current does not flow, because the impedance of the internal circuit 120 is high. In accordance with, the current first starts to flow through the protection element as mentioned above. When the current reaches the trigger current, the bipolar element starts to operate to clamp the applied voltage. In this case, because most of the current flows through the protection element and the common wiring pattern 110, the internal circuit 120 can be protected.

On the other hand, when a negative voltage is applied to the internal circuit 120 with respect to the ground terminal 102, there is a case that the impedance of the internal circuit 120 is low, as shown in FIG. 3. In this case, because an absolute value |Vsbm| of the clamped voltage is larger than the applied negative voltage even if the protection element enters the operation state, a lot of current flows through the internal circuit 120. When this current centers on a small area of the internal circuit 120, an element in the small area is sometimes damaged or destroyed. Further, because the impedance of the internal circuit 120 is low, there is a case that the current does not flow sufficiently through the protection element so that the bipolar element does not operate.

As a consequence, in the conventional electrostatic protection circuit shown in FIG. 1, there is the following problem. That is, a sufficient protection performance sometimes cannot be achieved, depending on the structure of the internal circuit 120, when the negative over-voltage is applied to the other terminal with respect to the ground terminal 102.

Next, an example of the internal circuit 120 will be described with reference to FIG. 1. Referring to FIG. 1, an inverter Inv1 is composed of a P-type MOS transistor TP1 and an N-type MOS transistor TN1, and an inverter Inv2 is composed of a P-type MOS transistor TP2 and an N-type MOS transistor TN2 in the same way. The input of the inverter Inv1 is selectively connected to one of an internal signal Φ and the ground (GND) potential in accordance with selection of a wiring pattern master slice switch SW.

For example, when the wiring pattern master slice switch SW is fixedly switched to the ground (GND) potential, the above-mentioned problem occurs. That is, when a positive voltage with respect to the Vdd terminal 101 is applied to the GND terminal 102, the N-type MOS transistor TN1 is set to the conductive state. Further, a PN junction between a P+-type impurity diffusion layer of the source/drain region of the P-type MOS transistor and an N well, i.e., a diode DS is set to a forward direction bias state, and a current flows to the Vdd terminal 101 via the N well. In this case, when the threshold voltage of the N-type MOS transistor TN1 is, for example, 0.7 V, the voltage with which the current abruptly increases in FIG. 3, i.e., a threshold voltage is about 1.6 V, because the built-in voltage of the diode DS is 0.9 V.

The threshold voltage of the electrostatic protection circuit is generally determined based on a breakdown voltage of the N+-type impurity diffusion layer, and is about 14 V. Therefore, when a positive surge voltage is applied to the GND terminal 102, large current flows through the inverter Inv1 so that degradation of the junction is caused or a gate insulating film is damaged.

In the above-mentioned example, whether or not it results in the destruction of the internal circuit 120 is greatly dependent upon the circuit structure of the internal circuit 120. Also, it depends on the dimension and layout of each element in the discharge path, e.g., the element shape, the wiring pattern impedance and so on, and is determined based on the magnitude of the discharge current and the concentration degree of the current.

FIG. 4 is a circuit diagram illustrating a second conventional example of the electrostatic protection circuit which is disclosed in Japanese Laid Open Patent Disclosure (JP-A-Heisei 2-119169). In the second conventional example, each of the terminals PIN1, PIN2 and PINn is connected to the common wiring pattern 110 by a parallel circuit composed of a thyristor and a diode. In this case, when a positive electrostatic pulse is applied to, for example, the pin 2 with respect to the pin 1 as a reference point, a discharge path is formed of the pin 1 PIN→the thyristor of the pin 1 PIN1→the common wiring pattern 110→the diode of the pin 2 PIN2→the pin 2 PIN2. When a negative electrostatic pulse is applied to the pin 2 with respect to the pin 1 as the reference point, a discharge current flows through the discharge path of the pin 2 PIN2→the thyristor of the pin 2 PIN2→the common wiring pattern 110 the diode of the pin 1 PIN1→the pin 1 PIN1, to protect the internal circuits Z.

FIG. 5 shows the I–V characteristic between the arbitrarily selected two pins when the internal impedance of the electrostatic protection circuit shown in FIG. 4 is infinite. The clamped voltage Vsbp can be represented as Vsbp= |Vsbm|=Vc+Vbi, like the case to be shown in FIG. 1. In this case, because the thyristor is used for a clamp element, the voltage Vc is about 1.5 V and this value is low, compared to the bipolar element in the first conventional example of FIG. 1. In accordance with, the clamped voltage Vsbp is Vsbp= |Vsbm|=1.5V+0.9V=2.4 V.

A problem of this electrostatic protection circuit is as follows. That is, if the thyristor as the protection element starts to operate due to such a cause as, e.g., power supply noise when the semiconductor circuit is normally used, a lot of current flows from the power supply terminal through the ground terminal, because the clamped voltage Vsbp is low. This current continues to flow until the power supply voltage is decreased to a voltage lower than the clamped voltage Vsbp of about 2.4 V (this is so-called latch-up phenomenon). In the worst case, there is the possibility to cause destruction of any element.

SUMMARY OF THE INVENTION

The present invention is made in the light of the above-mentioned circumstances. Therefore, an object of the present invention is to provide a semiconductor circuit device in which high electrostatic breakdown endurance can be achieved without decreasing latch up endurance.

In order to achieve an aspect of the present invention a semiconductor circuit device includes first and second terminals, an internal circuit connected between the first and second terminals, and a protection circuit including at least one clamp circuit and connected between the first and second terminals in parallel to the internal circuit, wherein a threshold voltage of the clamp circuit is set to a voltage lower than a threshold voltage of the internal circuit between the first and second terminals. The first and second terminals are external terminals.

The clamp circuit includes a MIS transistor connected between the first and second terminals, and a gate of the MIS transistor is connected to one of a source and a drain of the MIS transistor.

Also, the protection circuit includes a common wiring pattern, a first protection element connected between the first terminal and the common wiring pattern, and including a first clamp circuit which has a first clamp voltage lower than a first threshold voltage of the internal circuit when a positive voltage with respect to the second terminal is applied to the first terminal, and a second protection element connected between the second terminal and the common wiring pattern, and including a second clamp circuit which has a second clamp voltage lower than a second threshold voltage of the internal circuit when a positive voltage with respect to the first terminal is applied to the second terminal. In this case, the first protection element includes the first clamp circuit connected between the first terminal and the common wiring pattern, and a first diode connected in parallel to the first clamp circuit and having a cathode connected to the first terminal and an anode connected to the common wiring pattern, and the second protection element includes the second clamp circuit connected between the second terminal and the common wiring pattern, and a second diode connected in parallel to the second clamp circuit and having a cathode connected to the second terminal and an anode connected to the common wiring pattern.

The first clamp circuit may include a first bipolar transistor having a collector connected to the first terminal and an emitter and a base connected to the common wiring pattern, and the second clamp circuit may include a second bipolar transistor having a collector connected to the second terminal and an emitter and a base connected to the common wiring pattern.

Alternatively, the first clamp circuit may include a first thyristor having an anode connected to the first terminal and a gate and a cathode connected to the common wiring pattern, and the second clamp circuit may include a second bipolar transistor having a collector connected to the second terminal and an emitter and a base connected to the common wiring pattern. In this case, the first clamp circuit may further include a diode having a cathode connected to the first terminal and an anode connected to the common wiring pattern.

In order to achieve another aspect of the present invention, a semiconductor circuit device includes an internal circuit, a common wiring pattern, a plurality of external terminals including a ground terminal, and a plurality of protection elements, each of which is connected one of the plurality of external terminals and the common wiring pattern and includes a clamp circuit, wherein the clamp circuit of each of the plurality of protection elements respectively connected to the plurality of external terminals other than the ground terminal has a clamp voltage higher than a power supply voltage supplied to the internal circuit, and the clamp circuit of the protection element connected to the ground terminal as a ground terminal clamp circuit has a clamp voltage lower than those of the clamp circuits other than the ground terminal clamp circuit.

In order to achieve still another aspect of the present invention, a semiconductor circuit device includes first and second terminals, an internal circuit connected between the first and second terminals, and a protection circuit including at least one clamp circuit and connected between the first and second terminals in parallel to the internal circuit, wherein a clamp voltage of the clamp circuit is set to a voltage lower than a threshold voltage of the internal circuit between the first and second terminals.

DESCRIPTION OF THE PREFERRED EMBODIMENTS

An electrostatic protection circuit of a semiconductor circuit device of the present invention will be described below in detail with reference to the accompanying drawings.

Figure 12:
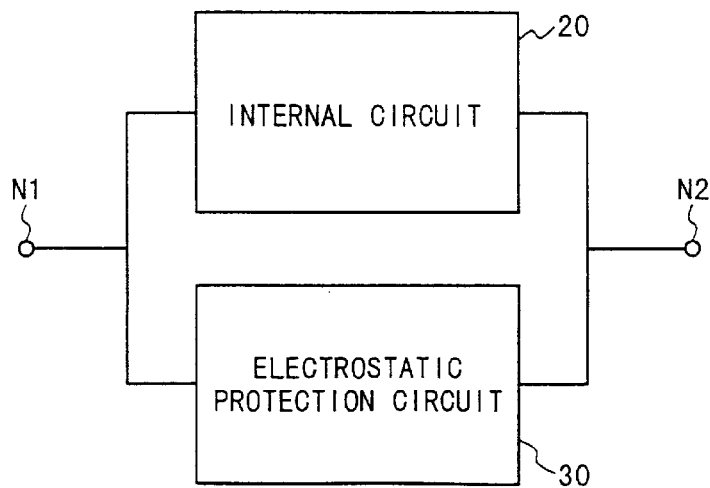
FIG. 12 is a basic concept diagram of the present invention.

FIG. 12 is a basic concept diagram of the present invention. Referring to FIG. 12, a surge voltage is possibly applied between two nodes N1 and N2 due to static electricity. The nodes N1 and N2 are, for example, a ground terminal and a power supply terminal. There are provided an internal circuit 20 and an electrostatic protection circuit 30 in parallel between the nodes Ni and N2. The internal circuit 20 has a relatively low threshold voltage. The electrostatic protection circuit 30 has a lower threshold value than that of the internal circuit 20. The electrostatic protection circuit 10 also has a clamp voltage lower than the threshold voltage of the internal circuit.

Figure 1:
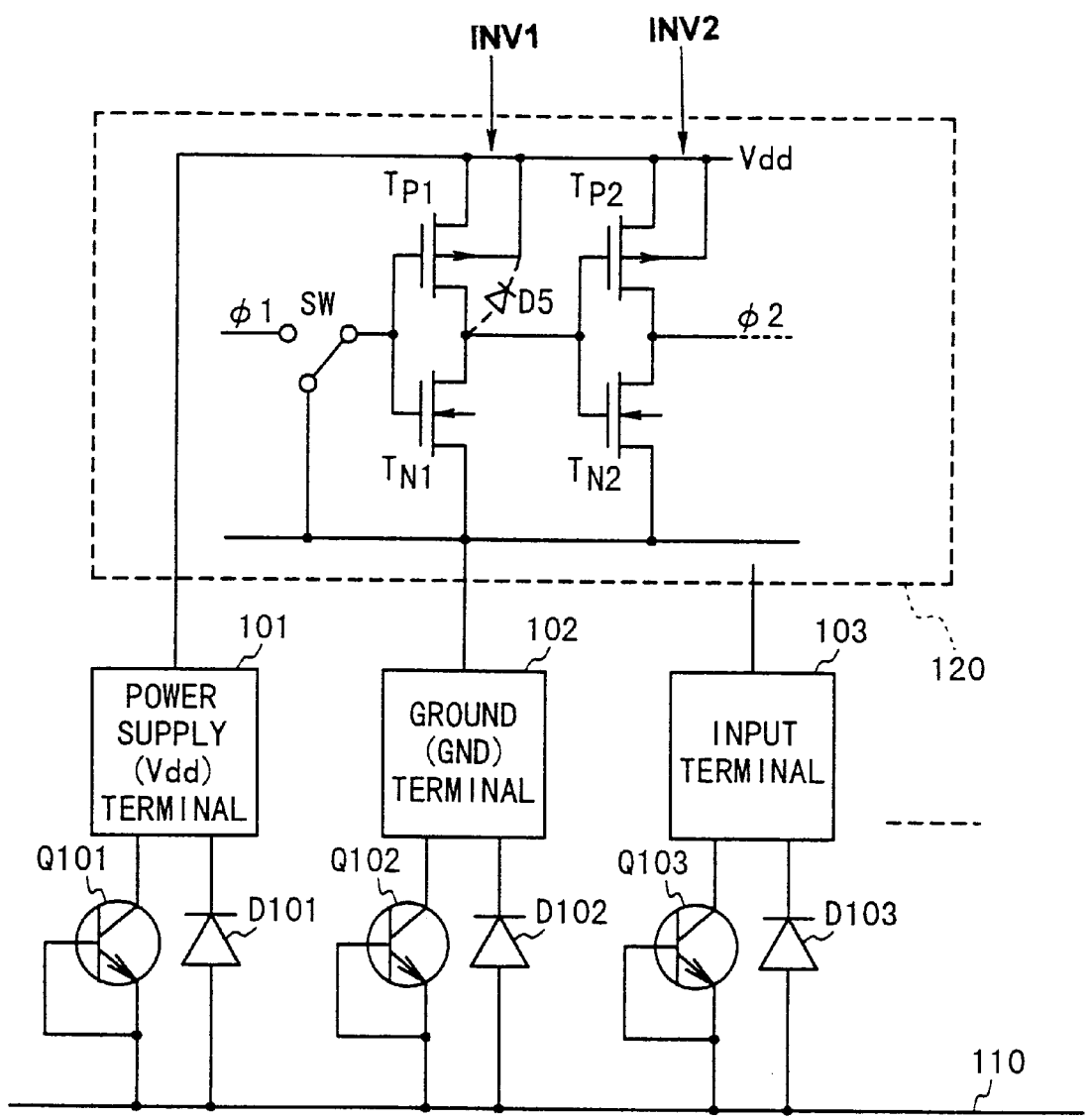
FIG. 1 is a circuit diagram illustrating the structure of a first conventional example of an electrostatic protection circuit.
Figure 2:
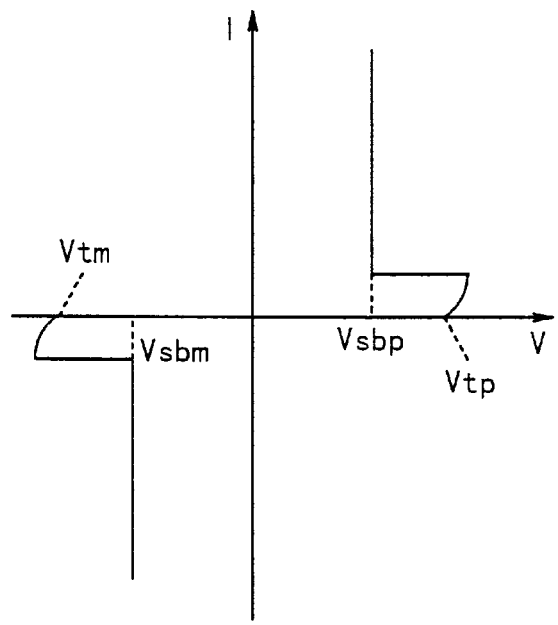
FIG. 2 is an I–V characteristic diagram of a protection element in the first conventional example of the electrostatic protection circuit shown in FIG. 1.
Figure 3:
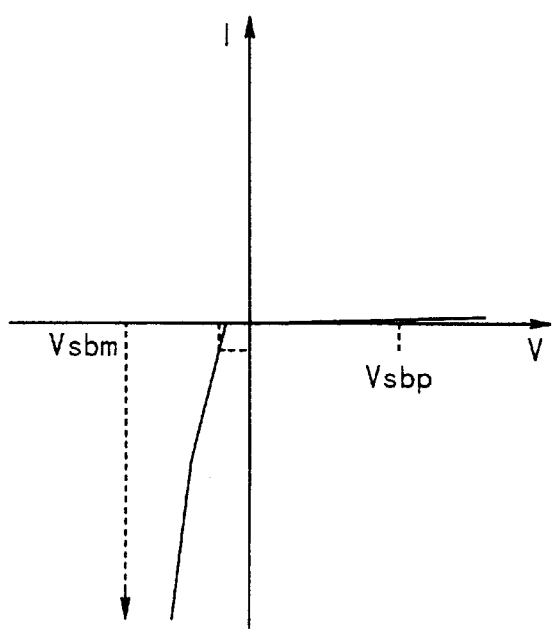
FIG. 3 is an I–V characteristic diagram of an internal circuit in the first conventional example of the electrostatic protection circuit shown in FIG. 1.
Figure 4:
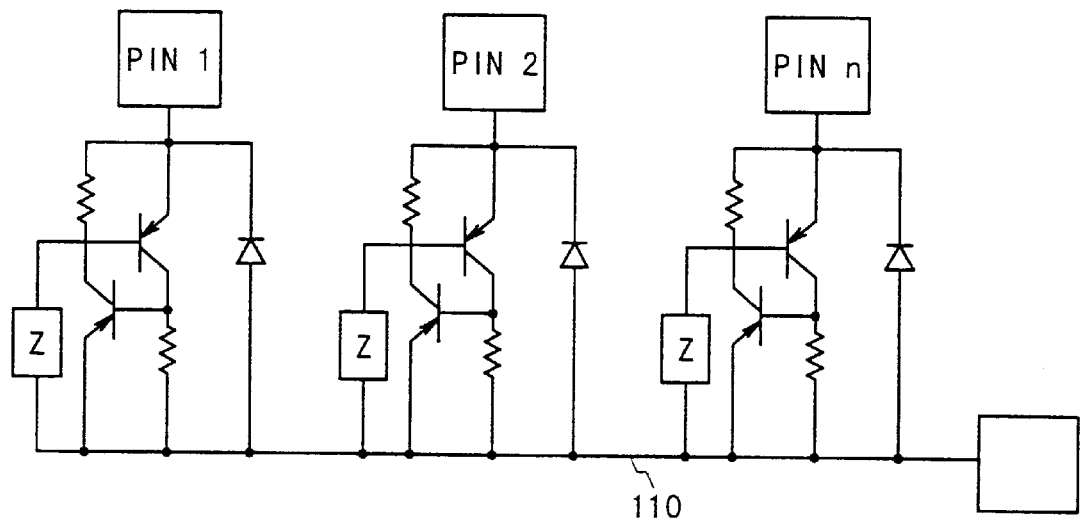
FIG. 4 is a circuit diagram illustrating the structure of a second conventional example of an electrostatic protection circuit.
Figure 5:
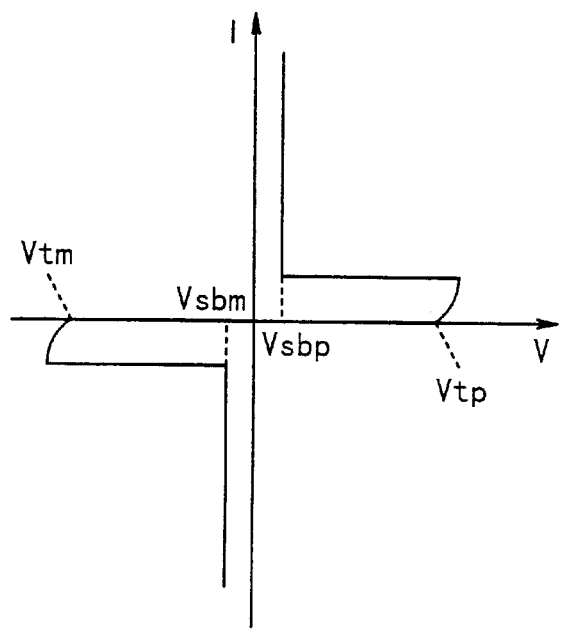
FIG. 5 is an I–V characteristic diagram of a protection element in the second conventional example of the electrostatic protection circuit shown in FIG. 4.
Figure 6:
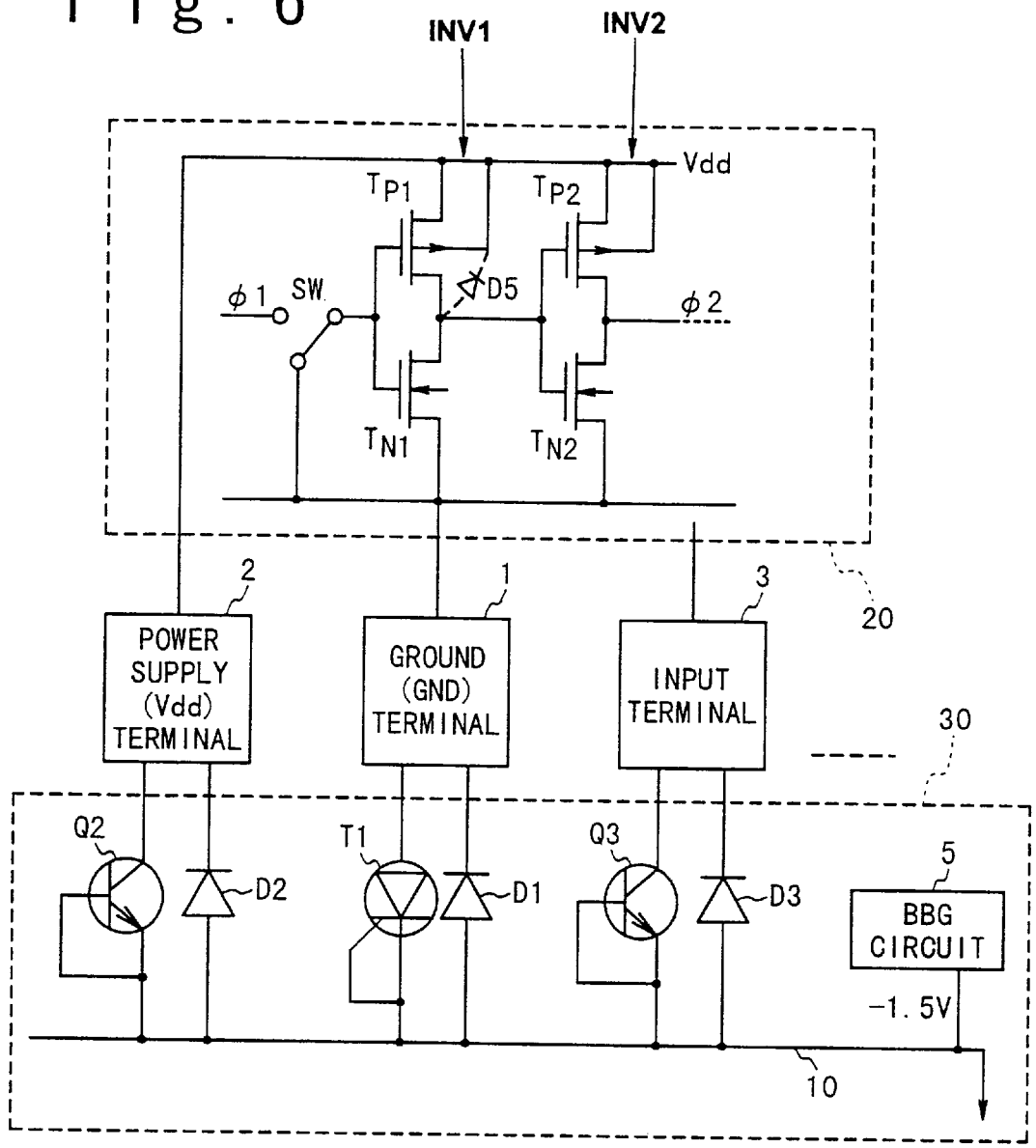
FIG. 6 is a circuit diagram illustrating the structure of an electrostatic protection circuit according to a first embodiment of the present invention.
Figure 7:
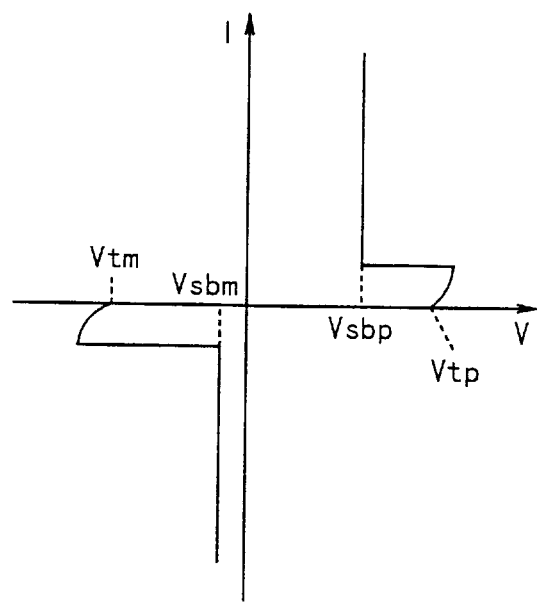
FIG. 7 is an I–V characteristic diagram of a protection element in the electrostatic protection circuit in the first embodiment shown in FIG. 6.

FIG. 6 is a circuit diagram illustrating the structure of an electrostatic protection circuit according to a first embodiment of the present invention. Referring to FIG. 6, the semiconductor circuit device is composed of an internal circuit 20, terminals such as a ground (GND) terminal 1, a power supply (Vdd) terminal 2, and signal input terminal 3, a common wiring pattern 10, protection elements respectively connected between the terminals and the common wiring pattern 10, and a back bias generator (BBG) circuit 5.

Each of the terminals 1 to 3 is connected to the internal circuit. The ground (GND) terminal 1 as a first node is connected to the common wiring pattern 10 by a first parallel protection element composed of a thyristor element T1 and a diode D1 connected in parallel. Another terminal such as the power supply (Vdd) terminal 2 as a second node is connected to the common wiring pattern 10 by a second protection element parallel circuit composed of a bipolar element Q2 and a diode D2 connected in parallel. In this embodiment, common wiring pattern 10 is formed of tungsten and is connected to a semiconductor substrate. In addition, the potential of the substrate is not set to the ground potential and is connected to the back bias generator (BBG) circuit 5 such that a negative voltage of, for example, −1.5 V is biased to the substrate. The substrate biased with the negative potential in this way is often used in an LSI such as a DRAM.

Figure 8:
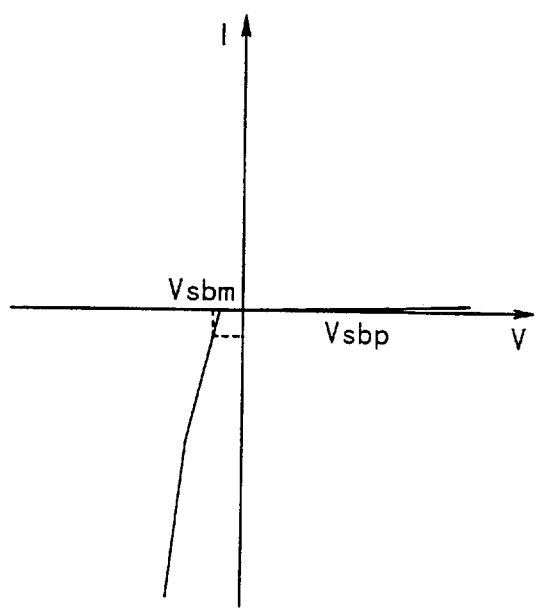
FIG. 8 is an I–V characteristic diagram of an internal circuit in the electrostatic protection circuit in the first embodiment shown in FIG. 6.

When a voltage is applied between the GND terminal 1 and another terminal other than the GND terminal 1, the characteristic of the internal circuit 20 in which any electrostatic protection circuit is not provided is as shown in FIG. 8, as described in the conventional example. In accordance with, if a positive over-voltage is applied to another terminal, e.g., the signal input terminal 3 with respect to the ground terminal 1 as a reference point, current does not flow through the internal circuit 20. The current starts to flow through the protection element which is connected to the signal input terminal 3 so that the protection element is triggered. As a result, a clamp element, i.e., the bipolar element Q3 connected to the input terminal 3 operates to clamp the voltage to Vsbp. In this case, the current path is the input terminal 3→the clamp element Q3 of the input terminal 3→the common wiring pattern 10→the diode D1 of the ground terminal 1→the ground terminal 1. If the resistance of the common wiring pattern 10 can be ignored, the clamp voltage Vsbp is about 8 V from Vsbp=Vc+Vbi=7 V+0.9 V=7.9 V.

On the other hand, when a negative over-voltage is applied to the signal input terminal 3 with respect to the ground terminal 1, some current flows because the impedance of the internal circuit 20 is low. However, a temporary high voltage is applied to the protection diode D1 of the ground terminal 1. The high voltage functions as a trigger to the thyristor element T1 so that the clamp element, i.e., the thyristor element T1 of the ground terminal 1 is set to the conductive state to clamp the voltage to Vsbm. In this case, the discharge current flows through a discharge path of the ground terminal 1→the thyristor element T1 of the ground terminal 1→the common wiring pattern 10→the diode D3 of the signal input terminal 3→the input terminal 3. The voltage Vsbm is about 2.4 V from |Vsbm|=Vc(thyristor)+ Vbi=1.5 V+0.9 V=2.4 V. Because the voltage to be applied to the internal circuit 20 is clamped to 2.4 V, the current flowing through the internal circuit 20 is remarkably limited, which provides good protection capability.

In the present invention, the thyristor element having a low clamp voltage is used as the clamp element of the ground terminal, and the bipolar element having a high clamp voltage is used for the other terminals. Therefore, the clamp voltage Vsbp is set to be higher than the power supply voltage.

In this manner, the above-mentioned problem is not caused as described in the conventional examples, i.e., the problem that the power supply terminal 2 or another terminal is applied with a high voltage so that the clamp element erroneously operates due to a noise voltage in a normal operation state. Even if the clamp element erroneously starts the clamp operation temporarily, the clamp element can not maintain the clamp state, because the DC voltage applied to the terminal is set to a value lower than the clamp voltage Vsbp.

Figure 9:
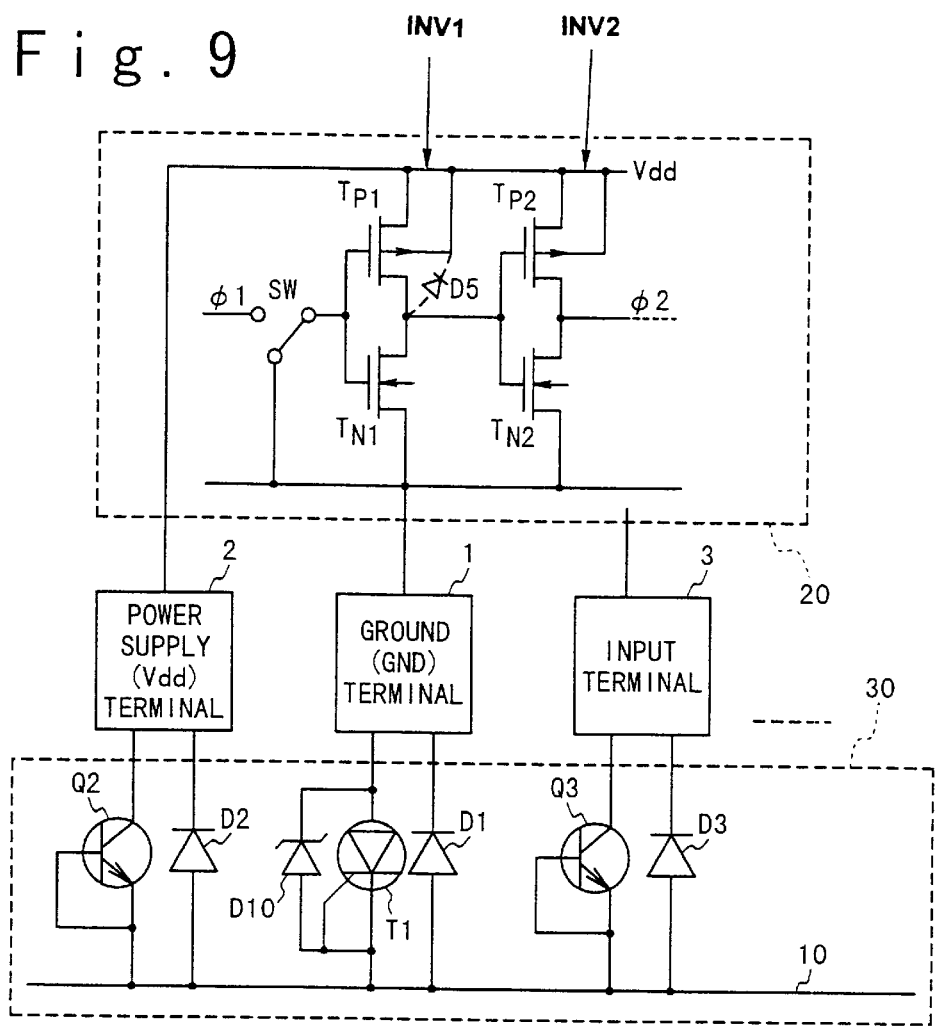
FIG. 9 is a circuit diagram illustrating the structure of an electrostatic protection circuit according to a second embodiment of the present invention.
Figure 10:
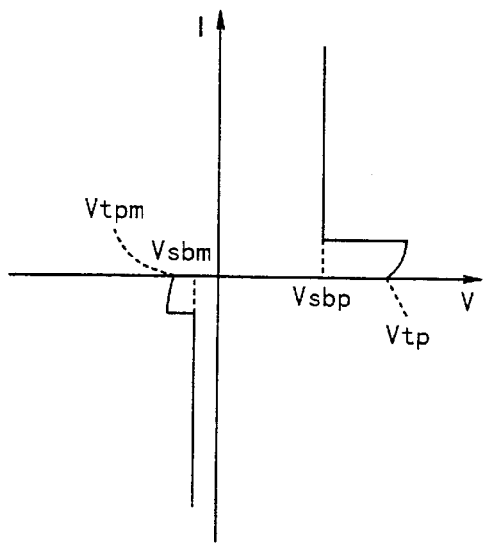
FIG. 10 is an I–V characteristic diagram of a protection element in the electrostatic protection circuit in the second embodiment shown in FIG. 9.

FIG. 9 is a circuit diagram illustrating the structure of the electrostatic protection circuit according to the second embodiment of the present invention. A difference in the electrostatic protection circuit of the first embodiment is in that a diode D10 having a low reverse direction breakdown voltage (3 V in this example) is provided in parallel to the thyristor element as the clamp element. FIG. 10 shows the I–V characteristic of the protection circuit in this case.

When a negative electrostatic voltage pulse is applied to another terminal, e.g., the power supply terminal 2 with respect to the ground (GND) terminal 1 as a reference point, the diode D10 is first broken down at the voltage Vtpm. The current functions as a trigger current so that the thyristor element is set to the conductive state to clamp voltage to Vsbm. However, because the breakdown voltage Vtpm is smaller than the breakdown voltage of the diode D10, the thyristor can be reliably set to the conductive state before a lot of current flows through the internal circuit 20.

Figure 11:
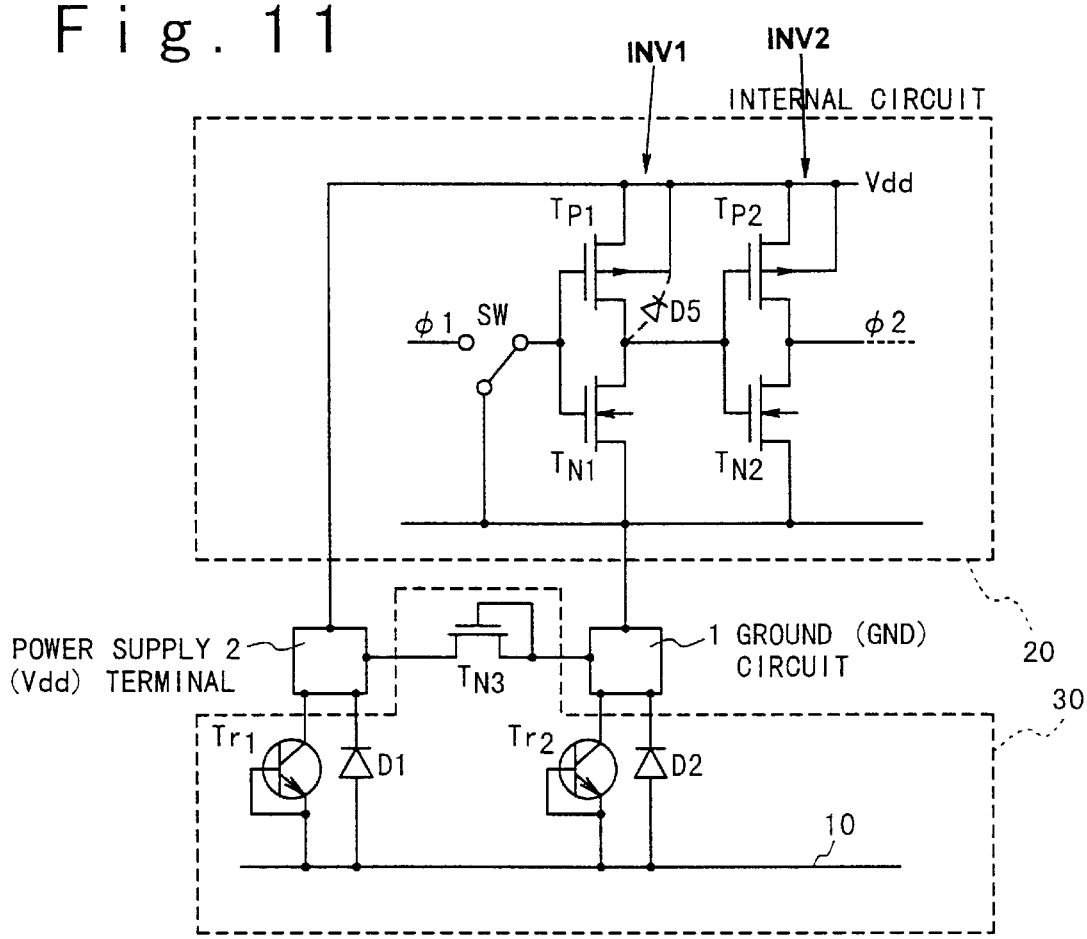
FIG. 11 is a circuit diagram illustrating the structure of an electrostatic protection circuit according to a third embodiment of the present invention.

As shown in FIG. 11, there is a case where the internal circuit 20 is provided in which a current flows from the ground (GND) terminal 1 to the power supply (Vdd) terminal 2 with a relatively low threshold voltage. In this case, a clamp element having a lower threshold voltage than that of the internal circuit 20, e.g., a MIS transistor such as an N-type MOS transistor TN3 in which a gate and a drain are connected together in this example is connected in parallel to the internal circuit 20.

Also, in this case, because the clamp element TN3 is arranged in the neighborhood of the inverter Inv1 of the transistors TP1 and TN1 in the internal circuit 20, it is possible to make the clamp element TN3 operate reliably. This is because the wiring pattern impedance can be especially matched.

As described above, according to the semiconductor circuit device of the present invention, there is obtained an effect that high electrostatic breakdown endurance can be achieved without decreasing latch up endurance.

What is claimed is:

1. A semiconductor circuit device comprising:
   first and second terminals;
   a protection circuit including:
      a common wiring pattern;
      a first protection element connected between said first terminal and said common wiring pattern, and including a first clamp circuit which has a first clamp voltage lower than a threshold voltage of an internal circuit when a positive voltage with respect to said second terminal is applied to said first terminal.
      a second protection element connected between said second terminal and said common wiring pattern, and including a second clamp circuit which has a second clamp voltage lower than the threshold voltage of said internal circuit when a positive voltage with respect to said first terminal is applied to said second terminal; and
      a MIS transistor connected between said first and second terminals in parallel with said internal circuit, a gate of said MIS transistor connected to one of a source or drain of said MIS transistor.

2. A semiconductor circuit device according to claim 1, wherein said first and second terminals are external terminals.

3. A semiconductor circuit device according to claim 1, wherein said first protection element includes:
   said first clamp circuit connected between said first terminal and said common wiring pattern; and
   a first diode connected in parallel to said first clamp circuit and having a cathode connected to said first terminal and an anode connected to said common wiring pattern, and
   wherein said second protection element includes:
      said second clamp circuit connected between said second terminal and said common wiring pattern; and
      a second diode connected in parallel to said second clamp circuit and having a cathode connected to said second terminal and an anode connected to said common wiring pattern.

4. A semiconductor circuit device according to claim 3, wherein said first clamp circuit includes a first bipolar transistor having a collector connected to said first terminal and an emitter and a base connected to said common wiring pattern, and
   wherein said second clamp circuit includes:
      a second bipolar transistor having a collector connected to said second terminal and an emitter and a base connected to said common wiring pattern.

5. A semiconductor circuit device according to claim 3, wherein said first clamp circuit includes a first thyristor having an anode connected to said first terminal and a gate and a cathode connected to said common wiring pattern, and
   wherein said second clamp circuit includes:
      a second bipolar transistor having a collector connected to said second terminal and an emitter and a base connected to said common wiring pattern.

6. A semiconductor circuit device according to claim 5, wherein said first clamp circuit further includes a diode having a cathode connected to said first terminal and an anode connected to said common wiring pattern.

7. A semiconductor circuit device comprising:
   first and second terminals;
   an internal circuit connected between said first and second terminals; and
   a protection circuit including;
      a common wiring pattern;
      a first protection element connected between said first terminal and said common wiring pattern, and including a first clamp circuit which has a first clamp voltage lower than a threshold voltage of said internal circuit when a positive voltage with respect to said second terminal is applied to said first terminal; and
      a second protection element connected between said second terminal and said common wiring pattern, and including a second clamp circuit which has a second clamp voltage lower than the threshold voltage of said internal circuit when a positive voltage with respect to said first terminal is applied to said second terminal and a a MIS transistor connected between said first and second terminals in parallel with the internal circuit, a gate of said MIS transistor connected to a drain of said MIS transistor.

8. A semiconductor circuit device according to claim 7, wherein said first protection element includes:

said first clamp circuit connected between said first terminal and said common wiring pattern; and a first diode connected in parallel to said first clamp circuit and having a cathode connected to said first terminal and an anode connected to said common wiring pattern, and wherein said second protection element includes:

said second clamp circuit connected between said second terminal and said common wiring pattern; and a second diode connected in parallel to said second clamp circuit and having a cathode connected to said second terminal and an anode connected to said common wiring pattern.

9. A semiconductor circuit device according to claim 8, wherein said first clamp circuit includes a first bipolar transistor having a collector connected to said first terminal and an emitter and a base connected to said common wiring pattern, and wherein said second clamp circuit includes:

a second bipolar transistor having a collector connected to said second terminal and an emitter and a base connected to said common wiring pattern.

10. A semiconductor circuit device according to claim 8, wherein said first clamp circuit includes a first thyristor having an anode connected to said first terminal and a gate and a cathode connected to said common wiring pattern, and wherein said second clamp circuit includes:

a second bipolar transistor having a collector connected to said second terminal and an emitter and a base connected to said common wiring pattern.

11. A semiconductor circuit device according to claim 10, wherein said first clamp circuit further includes a diode having a cathode connected to said first terminal and an anode connected to said common wiring pattern.

* * * * *